REGISTERS

Original Filed Jan. 11, 1946 8 Sheets-Sheet 1

INVENTORS
Philip H. Allen
Benjamin J. Chromy

REGISTERS

Original Filed Jan. 11, 1946 8 Sheets-Sheet 2

INVENTORS
Philip H. Allen
Benjamin J. Chromy
ATTORNEY

REGISTERS

Original Filed Jan. 11, 1946 8 Sheets-Sheet 3

INVENTORS

Philip H. Allen.

Benjamin J. Chromy

ATTORNEY

REGISTERS

Original Filed Jan. 11, 1946 8 Sheets-Sheet 4

INVENTORS

Philip H. Allen
Benjamin J. Chromy

ATTORNEY

REGISTERS

Original Filed Jan. 11, 1946 8 Sheets-Sheet 5

INVENTORS

Philip H. Allen
Benjamin J. Chromy

ATTORNEY

REGISTERS

Original Filed Jan. 11, 1946 8 Sheets-Sheet 6

INVENTORS
Philip H. Allen
Benjamin J. Chromy

REGISTERS
Original Filed Jan. 11, 1946 8 Sheets-Sheet 7
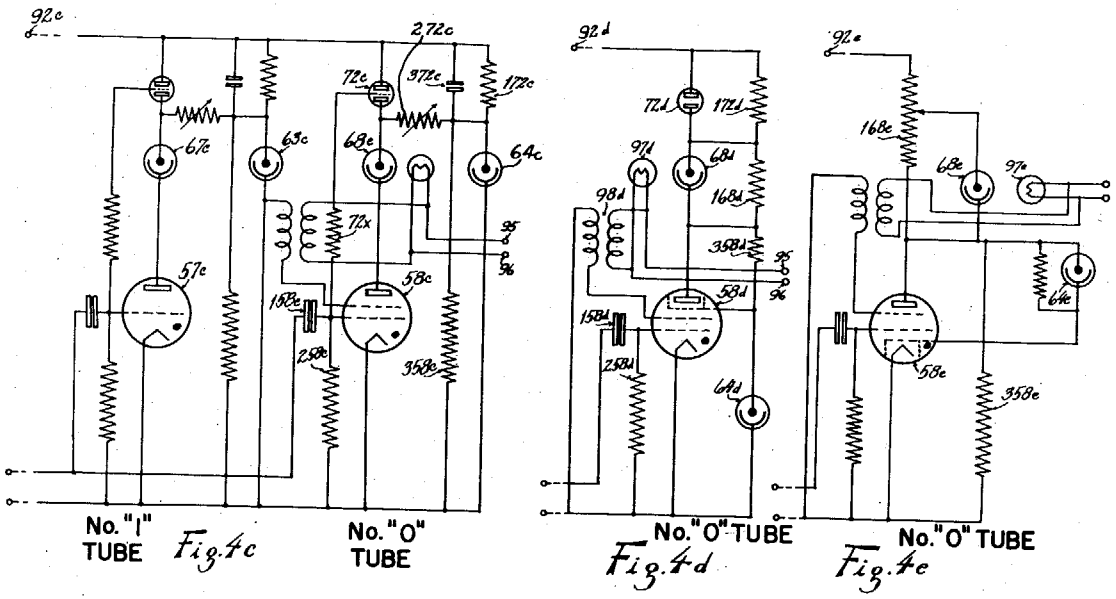
INVENTORS
Philip H. Allen
Benjamin J. Chromy

INVENTORS

Philip H. Allen

Benjamin J. Chromy

United States Patent Office

Re. 25,621
Reissued July 21, 1964

25,621
REGISTERS

Benjamin J. Chromy, 15335 Via Colina, and Philip H. Allen, 14590 Horseshoe Drive, both of Saratoga, Calif.

Original No. 2,727,683, dated Dec. 20, 1955, Ser. No. 640,464, Jan. 11, 1946. Application for reissue Feb. 8, 1960, Ser. No. 16,906
45 Claims. (Cl. 235—173)

Matter enclosed in heavy brackets [ ] appears in the original patent but forms no part of this reissue specification; matter printed in italics indicates the additions made by reissue.

The present invention relates to registers and is concerned more particularly with the provisions of improved adding and calculating apparatus employing electronic devices.

It is a general object of the invention to provide improved registering apparatus of ultra high speed operating characteristics.

Another general object of the invention is to provide registering apparatus including an improved register employing gaseous or other electric discharge devices in the various orders thereof.

Another general object of the invention is to provide improved selecting apparatus for registers in which light rays are employed in selecting the values to be entered into the registers.

Another object of the invention is to provide improved registering apparatus wherein thermionic discharge devices are employed in registering values.

Another object of the invention is to provide improved registering apparatus wherein light sensitive or responsive means is employed in effecting registry of values.

Another object of the invention is to provide an improved counting device employing thermionic tubes and light sensitive or responsive tubes or cells associated therewith in effecting a counting operation.

Another object of the invention is to provide an improved electronic registering apparatus having electrical tens transfer means employed in effecting a registering operation.

Another object of the invention is to provide a circuit in which the light from a gaseous discharge device is employed in connection with a light sensitive device to control operation of the discharge device.

Another object of the invention is to provide an electronic counting device of a reversible character.

A further object of the invention is to provide a registering or counting device responsive to electrical pulses in which the pulses can either be added to or subtracted from the values standing in the device.

A further object of the invention is to provide an improved selection mechanism for a register in which a selected number of light impulses can be produced in accordance with the desired value to be entered in the register.

Another object of the invention is to provide a selection apparatus in which the values from "1" to "9" can be represented by means of light.

A further object of the invention is to provide improved tens transfer mechanism for a register in which the control of the transferring operation is effected by means of light.

Another object of the invention is to provide registering apparatus having light control means for varying the ordinal position of the entry of values into the register.

A further object of the invention is to provide means for shifting the ordinal relation of a selection mechanism with respect to a register by the control of ordinal light rays or beams.

Other objects and advantages of the invention will be apparent from the following description of certain preferred embodiments thereof as illustrated in the drawings, in which:

FIGURE 4c is a fragmentary wiring diagram of another modification.

FIGURE 4d is a fragmentary wiring diagram illustrating a further modification of the register circuit.

FIGURE 4e is a fragmentary wiring diagram of still another modification of an ordinal circuit.

Generally, the invention comprises electronic registering apparatus in which the register or accumulator comprises ordinal sets of electric discharge devices so arranged and related that successive electrical impulses or differentially timed electrical signals applied to the various orders thereof will result in step by step registering of the pulses as increments, so that the register can be employed in adding, subtracting, multiplying and dividing operations.

The selecting mechanism in accordance with the instant invention includes means for producing a number of light impulses corresponding to the values set in the keyboard in cyclic fashion and the use of light sensitive devices to convert the light impulses to electrical impulses for entry in the accumulator. Also associated with the cyclic light impulses employed for entering values during a digitation operation are sequential light impulses for transferring operations, one impulse being produced in each order during each cycle for operating the tens transfer circuits between the respective orders of the accumulator if these have been properly conditioned by the passing of one of the orders of the register from nine to zero.

In order to provide for selective entry of the ordinal impulses from the selecting mechanism in various ordinal positions in the accumulator, a circuit network is interposed between the selecting mechanism and the register, including a plurality of series of light sensitive tubes or cells which can be selectively illuminated to control the ordinal position of entry of values into the register.

Also associated with the register is a zero setting apparatus in the form of means for disabling the various orders of the register to erase any values registered therein and for immediately thereafter enabling the zero electric discharging devices of each order so that all of the orders of the register will display the value zero.

Figure 1:
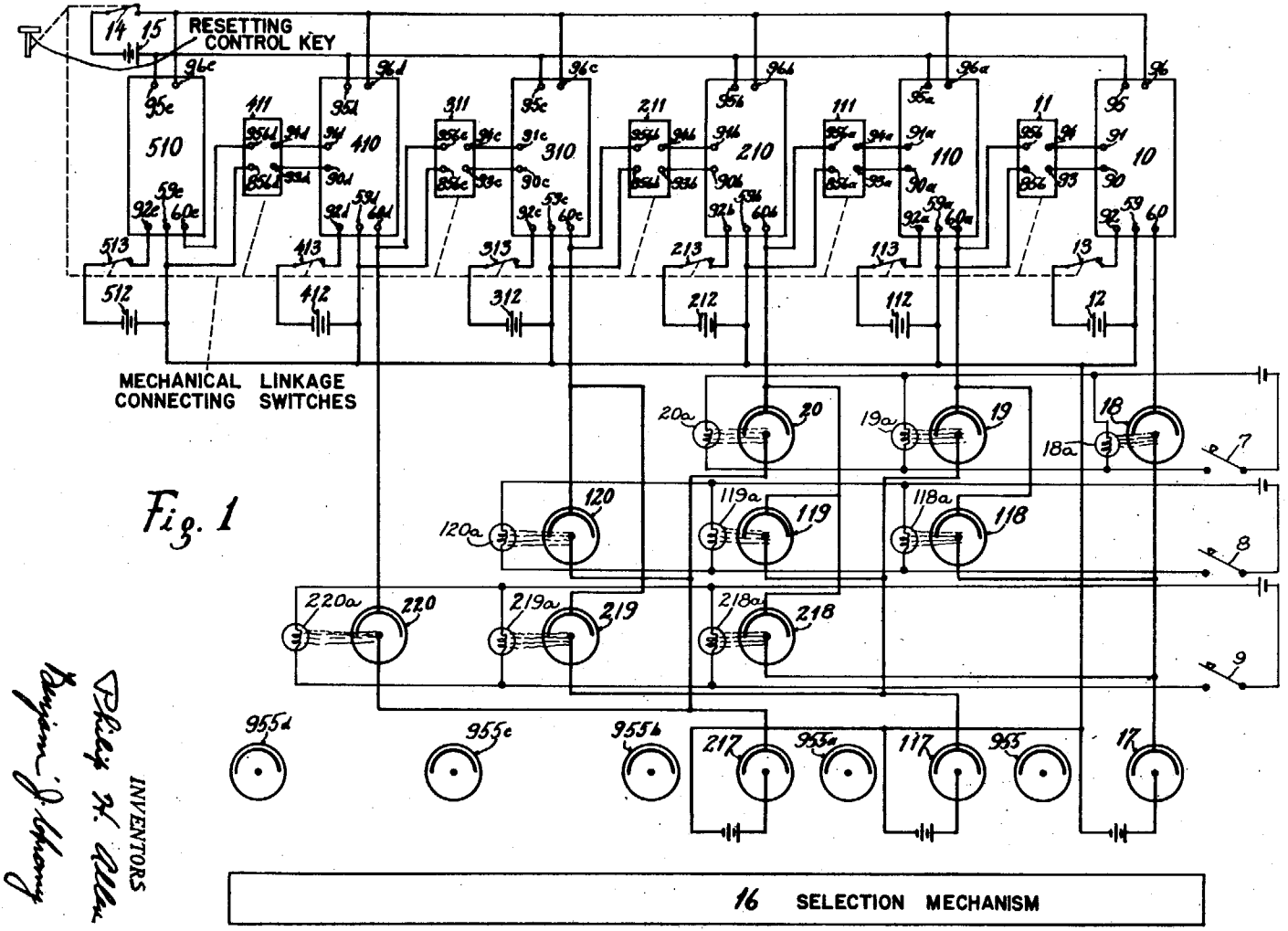
FIGURE 1 is a schematic wiring diagram of the register.

Referring to FIGURE 1, the sets of electric discharge devices comprising the orders of the register are indicated schematically at 10, 110, 210, 310, 410 and 510, six orders having been illustrated although obviously any desired number of orders may be provided. Interposed between the ordinal circuits 10, 110, etc., are respective transfer circuits 11, 111, 211, 311 and 411 for performing the tens transferring operations in a manner later described. Each ordinal register circuit is provided with an associated source of potential shown as a battery 12, 112, 212, etc., each including in its circuit a normally closed switch 13, 113, 213, etc., respectively, whereby the registered value standing in any order can be erased by opening of the associated switch 13, 113, etc., this opening of the switches being effected as a gang, as later described, and in combination with the closing of a switch 14 forming part of a pulse applying circuit, including a battery 15 employed to cause firing of the zero electric discharge device of each of the ordinal register circuits.

The selection mechanism is indicated schematically by the block diagram 16 in FIGURE 1, and serves, as later described, to provide one or more light impulses for impingement upon the electrodes of the ordinal phototubes 17, 117 and 217 which serve to transform the light impulses to electrical impulses for application to the ordinal registering circuits. The phototubes 17, 117 and 217 correspond to three orders in the selection mechanism although additional orders can also be provided if desired.

Interposed between the phototubes 17, 117 and 217 are a plurality of sets of phototubes including the set 18, 19 and 20, the set 118, 119 and 120, and the set 218, 219 and 220. The set 18, 19 and 20, when illuminated, serves to connect the three orders of the selection mechanism to the three lowerst orders 10, 110 and 210 of the register. The set of phototubes 118, 119 and 120, when illuminated, serves to connect the three orders of the selection mechanism to the second, third and fourth orders, namely, the circuits 110, 210, and 310, while the set of phototubes 218, 219 and 220 serves to connect the three orders of the selection mechanism to the registering circuits 210, 310 and 410, respectively. Any suitable form of light source may be provided to illuminate selectively each of the three sets of order selecting light sensitive tubes 18, 19 and 20, etc. For example, lamps 18a, 19a and 20a may be associated respectively with the phototubes 18, 19 and 20 and be under control of a common switch 7. Thus when the lamps 18a, 19a and 20a are illuminated upon closing of the switch 7 the tubes 18, 19 and 20 are illuminated as a group and the circuit between the light sensitive tube 17 and the input terminals 59 and 60 of the register 10 is conditioned so that light impulses transmitted to the light sensitive tube 17 from the selection mechanism 16 may be converted into electrical impulses and these may be fed to the input of the register 10. Likewise illuminating the light sensitive tube 19 conditions the imput circuit between the light sensitive tube 117, and the terminals 59a and 60a of the register 110 so that light impulses transmited to the light sensitive tube 117 from the selection mechanism 16 may be converted into electrical impulses and these may be fed to the input of the register 110. In the same manner illuminating the light sensitive tube 20 conditions the circuit between the light sensitive tube 217 and the input terminals 59b and 60b of the register 210 so that light impulses transmitted to the light sensitive tube 217 from the selection mechanism 16 may be converted into electrical impulses and these may be fed to the input of the register 210. On the other hand if the light sensitive tubes 18, 19 and 20 are not illuminated but the light sensitive tubes 118, 119 and 120 are illuminated by closing the switch 8 to the lamps 118a, 119a and 120a associated with the tubes 118, 119 and 120 respectively, the input circuits of the registers 110, 210 and 310 are respectively conditioned to receive electrical pulses from the light sensitive tubes 17, 117 and 217 respectively. Thus light impulses from the selection mechanism 16 transmited to the light sensitive tube 17 are converted into electrical impulses and fed through the illuminated tube 118 to the input terminals 59a and 60a of the register 110. Light impulses transmitted from the selection mechanism 16 to the light sensitive tube 117 are converted into electrical impulses and fed through the illuminated tube 119 to the input of the register 210. Also light impulses fed to the light sensitive cell 217 are converted into electrical impulses and fed through the illuminated tube 120 to the input of the register 310. When the switch 9 is closed and the light sensitive tubes 218, 219 and 220 are illuminated by the lamps 218a, 219a and 220a respectively, the input circuits of the registers 210, 310 and 410 are conditioned to receive pulses from the light sensitive tubes 17, 117 and 217 respectively. Thus the light impulses received by the light sensitive tube 17 from the selection mechanism 16 are converted into electrical impulses and transmitted through the illuminated light sensitive tube 218 to the input of the register 210. Light impulses received by the tube 117 from the selection mechanism 16 are converted into electrical impulses and fed through the illuminated tube 219 to the input of the register 310. Also the light impulses received by the light sensitive tube 217 from the selection mechanism 16 are converted into electrical impulses and fed through the illuminated tube 220 to the input of the register 410.

SELECTING MECHANISM

Figure 2:
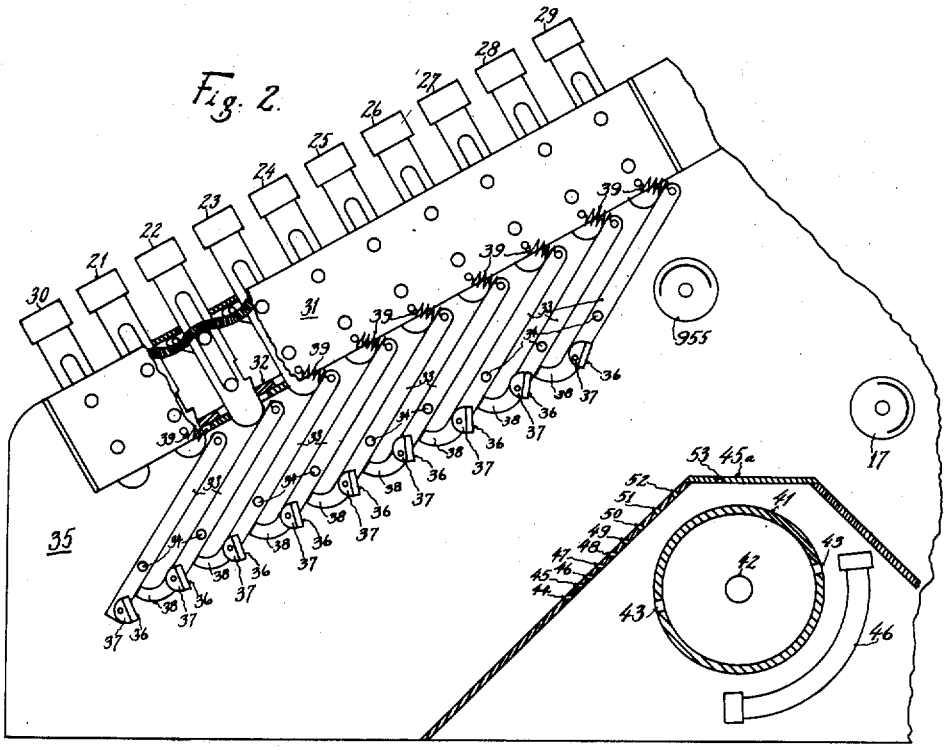
FIGURE 2 is a sectional view illustrating one order of the selection mechanism.

Referring to FIGURE 2, there is illustrated one order of the selecting mechanism including a set of nine value keys 21 through 29, respectively, and a zero or clear key 30 mounted for vertical sliding movement in a conventional manner in a frame 31. The usual form of latching slide 32 is associated with the bank of keys to hold any depressed key in operated position. Associated with the bank of keys 21 through 29, inclusive, are a series of similar mirror supporting levers 33 each of which is pivotally mounted at 34 on the adjacent frame plate 35, and each carrying a mirror 36. For example, the mirror 36 may be carried by a supporting bracket 37 riveted or otherwise secured to the associated lever 33. Each of the levers 33 is provided with an ear 38 disposed below the pivot 34 of the lever 33 of next lower value so that when any higher order value key of the keys 21 through 29 is depressed the levers 33 associated with all of the lower order value keys will also be rocked about their pivot points 34. Normally, that is in the raised position of the keys 21 through 29, position of the levers 33 under the influence of their associated springs 39 is such that the mirrors 36 are inactive.

Associated with the set of mirrors 36 in each order there is provided a light impulse producing mechanism which provides nine impulses in each order during each cycle of rotation, the number of these impulses which are effective being controlled by the positioning of the mirrors 36 in accordance with the value of the depressed key.

The light impulse producing mechanism includes a cylindrical drum 41 which is supported at its ends by suitable journals 42 and is operated one-half rotation for each cycle of operation of the apparatus through a conventional form of motor and clutch drive (not shown). In alignment with each set of mirrors 36 of the drum 41 is provided with a pair of diametrically opposed apertures 43 adapted to sweep a beam of light past a series of apertures 44 through 52, respectively, in a housing 45a enclosing the drum 41. The beam of light may be supplied from a suitable source of light, such as, for example, a neon or fluorescent tube 46 which may be provided in alignment with each set of apertures 43 and constantly illuminated from a suitable source of electricity.

With reference to FIGURE 2, it will be noted that the respective apertures 44 through 52 are aligned to permit the light beam as it sweeps past these apertures to impinge successively on the mirrors 36 from the No. 1 mirror through the No. 9 mirror and these mirrors are so disposed when placed in operative position as to reflect these light impulses to the associated light sensitive device, for example, the phototube 17, so that from one to nine light impulses may be selectively provided in each order of the selecting mechanism depending upon the value of the key 21 through 29 that may be depressed.

In order to provide the actuating or firing pulse for the various transfer circuits, an aperture 53 is provided in the housing 45a disposed to direct a light pulse when aligned with respective apertures 43 of the drum 41 onto a light sensitive transfer actuating or firing cell or tube 955 of the tens transfer circuit associated therewith to cause operation of the tens transfer in a manner later described. As is conventional in calculating machine practice, the series of apertures 53 corresponding to the various orders of the transfer mechanism are arranged in sequentially offset relation in the housing 45a so that the light pulses for the lowest order transfer becomes effective first, the light pulses through the second order aperture 53 becomes effective next, and so on in ascending order through the orders of the carry mechanism.

REGISTER

Figure 4:
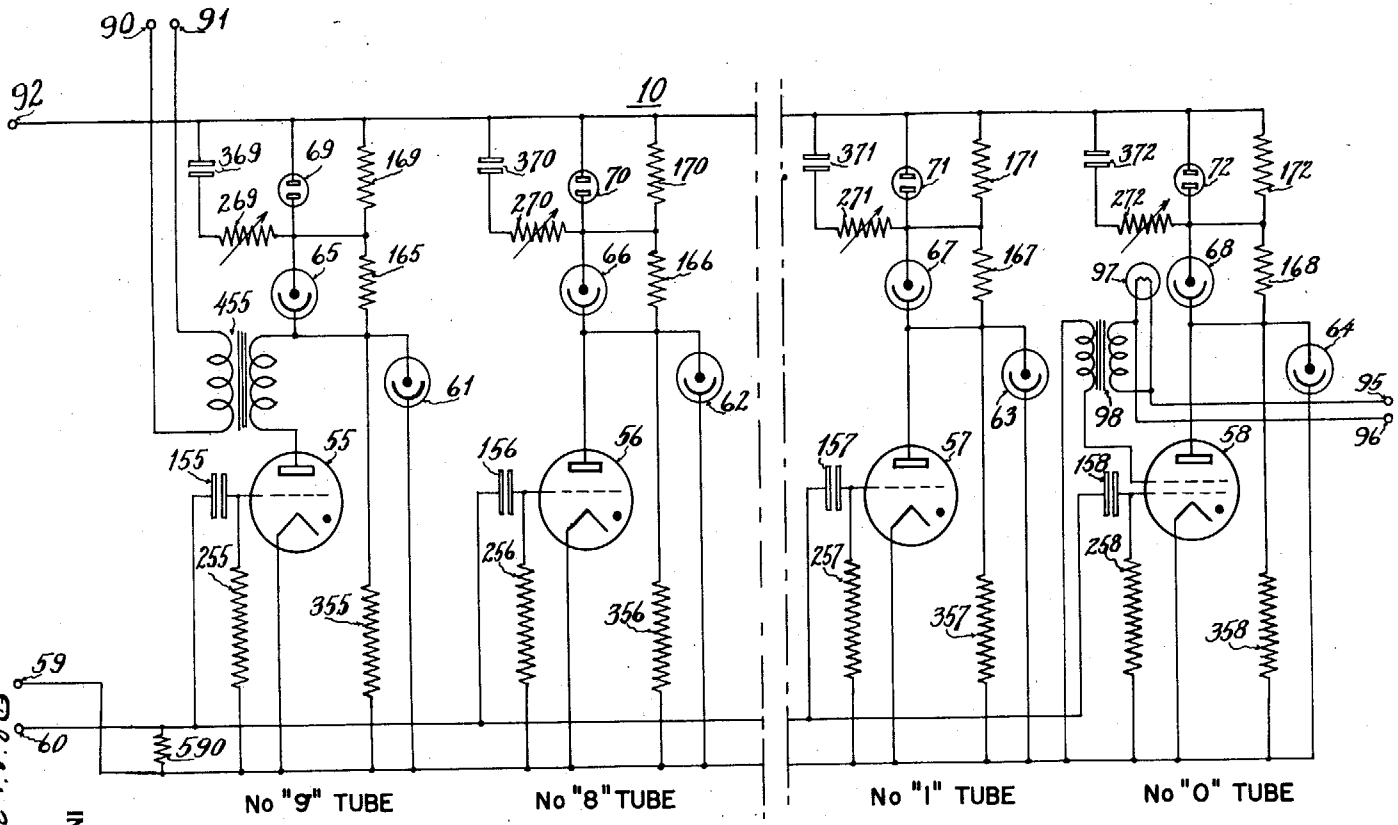
FIGURE 4 is a wiring diagram of the units order of the accumulator register.
Figure 4A:
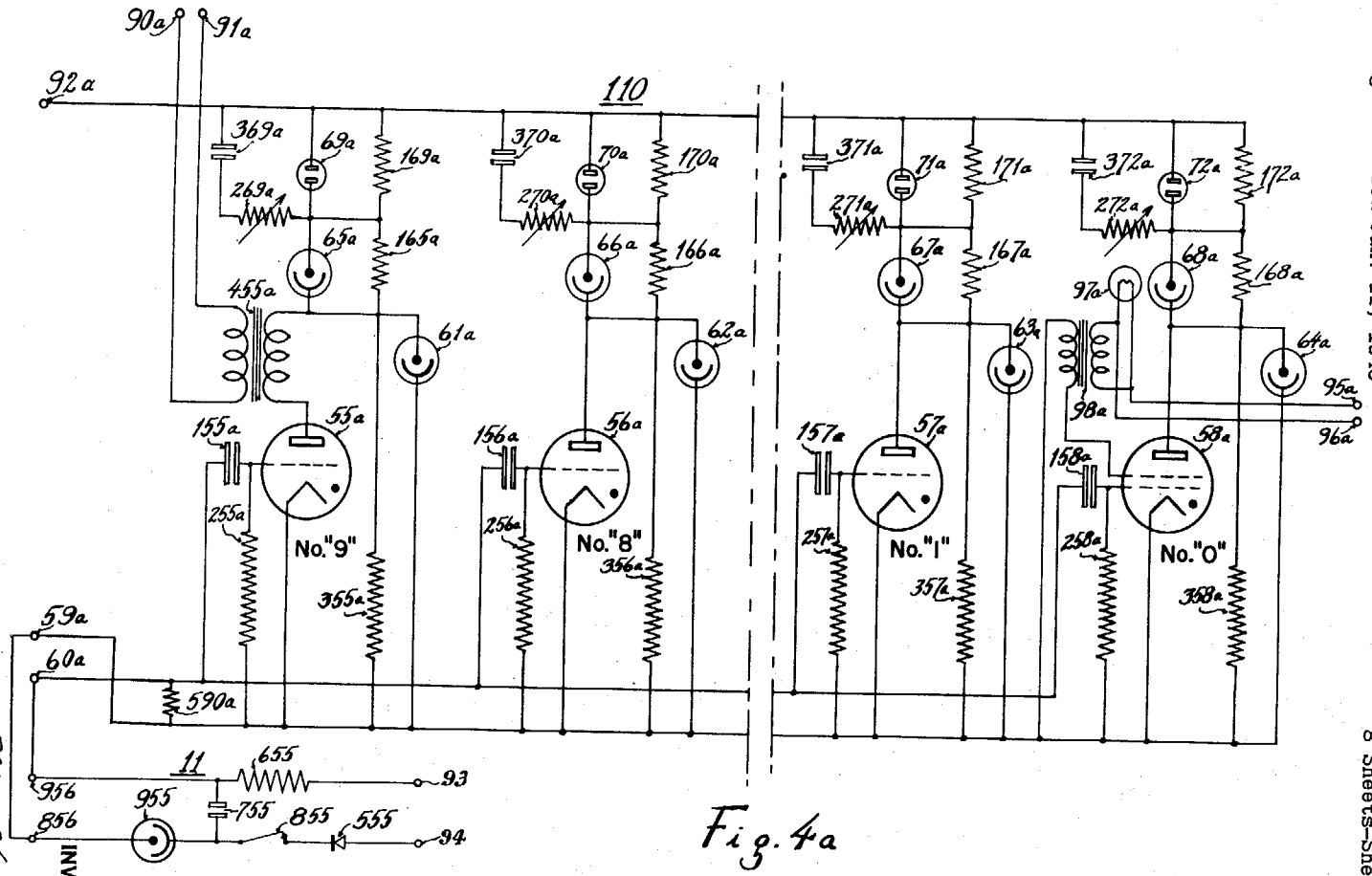
FIGURE 4a is similar to FIGURE 4 but shows the "10's" order of the register.

The register consists of a plurality of devices indicated schematically in FIGURE 1 by the apparatus 10, 110, 210, 310, 410 and 510. The circuits of each of these devices 10, 110, 210, etc. are substantially identical and these are shown in FIGURES 4 and 4a, the apparatus shown in FIGURE 4 comprising the apparatus shown schematically as device 10 of FIGURE 1 and the apparatus of FIGURE 4a comprising that shown schematically as device 110 of FIGURE 1. The devices 210, 310, 410 and 510 are the same as that shown in FIGURE 4a except that the apparatus 510 does not ncessarily include a lens transfer circuit connected to the output of the No. 9 tube.

The register shown in FIGURE 4 consists of a plurality of thermionic tubes, such as 55, 56, 57 and 58, which may be of the three-electrode or multiple-grid type with directly or indirectly heated cathodes or filaments or cold cathode type, as desired. Furthemore, these tubes are preferably of the gas discharge type provided with an evacuated envelope of glass or similar transparent or translucent material coated on the inside over at least a part of the surface with a fluorescent material, such as willemite, scheelite, zinc sulphide or the like. A small amount of mercury is provided in the inside of each of these envelopes for the purpose of generating ultraviolet radiations when the respective tubes are fired or triggered by suitable electrical pulses applied to the grids thereof, the aforesaid ultraviolet radiations being employed to bombard the fluorescent coatings inside of the triggered tubes and the fluorescent coatings caused to fluoresce. The fluorescent light is employed to enable the various tubes of the register as will be apparent from further paragraphs of this description and it is of course obvious that instead of this fluorescent light, the light produced by an ionized gas may be used. In this case the thermionic tubes of the registers need not be provided with fluorescent coatings as described above but the envelopes thereof may simply be filled with a suitable atmosphere of inert gas, such as, neon, argon, helium, krypton, xenon or nitrogen or suitable mixtures thereof with or without a small drop of mercury after the air is evacuated from the envelopes.

The input terminals 59 and 60 are connected to the inputs of all of the tubes 55, 56, 57 and 58 so that an electric pulse from the light sensitive tubes 17 and 18 is applied through these terminals to the aforesaid input circuits. Each of the thermionic tubes 55, 56, 57 and 58 is shunted by a light sensitive tube or cell 61, 62, 63 and 64, respectively, and light sensitive tubes or cells 65, 66, 67 and 68 are connected in series with the thermionic tubes 55, 56, 57 and 58, respectively. Likewise, the glow tubes 69, 70, 71 and 72 are connected in series with the light sensitive tubes or cells 65, 66, 67 and 68, respectively. These glow tubes 69, 70, 71 and 72 may be provided with fluorescent coatings therein as described above in the cases of thermionic tubes 55, 56, 57 and 58, or they may be simply filled with an inert gas or gases so that they will either fluoresce or glow when they are energized.

The tube 58 is the "zero" tube, tube 57 is the No. 1 tube and this is followed by the No. 2, No. 3, No. 4, No. 5, No. 6 and No. 7 tubes (not shown). The No. 7 tube is followed by the tube 56 which is the No. 8 tube and this is followed by tube 55 which is the No. 9 tube.

Figure 3:
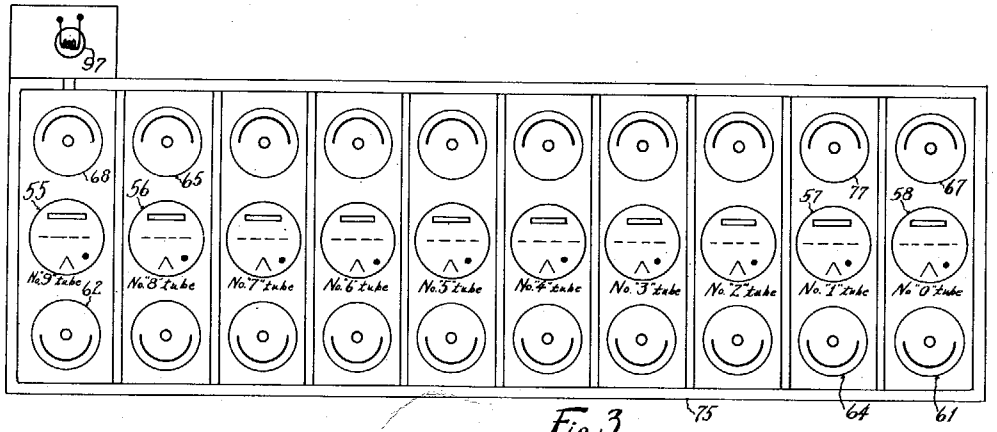
FIGURE 3 is a schematic plan view showing the arrangement of the tubes of one order of the accumulator register.

FIGURE 3 illustrates a physical arrangement of the thermionic tubes of a register circuit and the associated light sensitive tubes or cells for exercising the control of the circuit as described above.

Each registering circuit is provided with an enclosing housing 75 having a plurality of opaque partitions dividing the housing into ten compartments for ten sets of tubes. For example, the compartment containing the thermionic tube 58 corresponding to the value "0" would also contain the light sensitive cell 67 which operates to enable the "1" thyratron 57 as well as the light sensitive cell 61 which serves to disable or quench the "9" thyratron 55. Correspondingly, the compartment containing the thyratron 57 corresponding to the No. "1" would contain the light sensitive cell 64 for quenching the thyratron 58 as well as the light sensitive cell 77 for enabling the thyratron 78 corresponding to the numeral "2." The other thyratrons and light sensitive cells of an ordinal circuit are similarly disposed within the respective compartments.

While only four thermionic tubes 55 through 58 are shown in FIGURE 4, it will be understood that ten such tubes representing the values "0" through "9," inclusive, are provided in each ordinal register circuit as shown in FIGURE 3 and the corresponding numbers are applied to the glow discharge tubes 69, 70, 71 and 72 so that the number corresponding to the tube firing is illuminated and displayed.

The grids of the tubes 58, 57, 56 and 55 are connected to the input terminal 60 through capacitors 158, 157, 156 and 155, respectively, and the cathodes of these tubes are all connected to the input terminal 59, the aforesaid terminals 59 and 60 being connected together by a high resistance resistor 590. Grid leak resistors 258, 257, 256 and 255 are connected between the control grids and cathodes of the tubes 58, 57, 56 and 55, respectively. Resistors 358, 357, 356 and 355 are connected across the tubes 58, 57, 56 and 55, respectively, and these resistors are shunted by the light sensitive or responsive tubes or cells 64, 63, 62 and 61, respectively.

As previously described, light sensitive tubes or cells 68, 67, 66 and 65, shunted by resistors 168, 167, 166 and 165, respectively, are connected in series with the outputs of the tubes 58, 57, 56 and 55, respectively. Glow discharge or gas tubes 72, 71, 70 and 69, shunted by resistors 172, 171, 170 and 169, respectively, are connected in series with the light sensitive tubes or cells 68, 67, 66 and 65, respectively. These glow discharge tubes 72, 71, 70 and 69 are also shunted by R-C networks consisting of resistors and capacitors connected in series across the respective glow discharge tubes. These R-C networks function to stabilize the circuit and prevent transient impulses. Thus variable resistors 272, 271, 270 and 269 are connected in series with capacitors 372, 371, 370 and 369, respectively, and these series connected elements are in turn connected across the glow discharge tubes 72, 71, 70 and 69, respectively. The batteries 12, 112, 212, etc. shown in FIG. 1 furnish the anode potentials for the registers 10, 110, 210, etc. and are connected to appropriate terminals of these registers as illustrated.

The register shown in FIGURE 4a constitutes the tens order of the register or totalizer and is identical with FIGURE 4 except for the addition of carry control elements conditioned by carry impulses from the terminals 90 and 91 in FIGURE 4. The FIGURE 4a embodiment consists of a plurality of tubes, such as tubes 55a, 56a, 57a and 58*a*, which are identical to the tubes 55, 56, 57 and 58 shown in the register of FIGURE 4. This register also includes additional tubes which are not shown, the same as the register illustrated in FIGURE 4, and the tubes 55a, 56a, 57a and 58a may be designated as the No. 9 tube, No. 8 tube, No. 1 tube and the "0" tube, respectively, the same as corresponding tubes in FIGURE 4. The same or similar circuit elements are associated with the tubes 55a, 56a, 57a and 58a, as are associated with the corresponding tubes shown in FIGURE 4 and like elements of FIGURES 4 and 4a are designated by like reference numerals except that the reference numerals employed in FIGURE 4a each have the letter "a" as a suffix.

The different orders 10, 110, 210, 310 and 410 of the register are provided with positive anode battery terminals 92, 92a, 92b, 92c, 92d and 92e, respectively, and these terminals are connected to the anode battery switches 13, 113, 213, 313, 413 and 513, respectively, for the purpose of connecting the positive terminals of the batteries 12, 112, 212, 312, 412 and 512, respectively, to the aforesaid respective terminals.

TRANSFER CIRCUIT

The register circuit of FIGURE 4 is provided with a transfer circuit in the output of the No. 9 tube, that is, tube 55, for tens transfer purpose, whereby tens transfer pulses are fed to the input terminals 59a and 60a of the circuit shown in FIGURE 4a.

This transfer circuit consists of a transformer 455 (FIGURE 4) having the primary thereof connected in series with the anode of the tube 55 and the tube output circuit. The secondary of the transformer 455 is connected to terminals 90 and 91, terminal 90 being connected to the terminal 93 of the rectifier 555 of the tens transfer circuit 11 and the terminal 91 being connected to the terminal 94 of the tens transfer circuit 11. A tens transfer switch or key 855 is connected in series with the rectifier 555, the capacitor 755 and light sensitive tube or cell 955. Furthermore, the capacitor 755 is connected in series with the aforesaid light sensitive tube or cell 955 across a pair of output terminals 856 and 956, and these in turn are connected to the terminals 59a and 60a, respectively, of FIGURE 4a.

Thus, a tens transfer pulse occasioned by the extinguishing of the No. 9 tube 55 will serve to charge the capacitor 755, the rectifier 555 serving to prevent charging of this capacitor upon initial firing of the tube 55. Subsequently, when the light sensitive cell or tube 955 is rendered conducting or active by a light ray from the selection drum 41 and the associated aperture 53 thereof, the capacitor 755 will be discharged. A tens transfer pulse is accordingly fed to the input terminals 59a and 60a of FIGURE 4a as outlined above, whereby a tens transfer pulse may be impressed upon the output or grid circuit of any one of the register tubes 58a, 57a, 56a or 55a of FIGURE 4a, depending upon which of these tubes is conditioned to receive the pulse.

Similarly, the No. 9 tube, that is, tube 55a of the register 110 shown in FIGURE 4a is provided in the output circuit thereof with a tens transfer circuit coupled to the output of this tube by means of the transformer 455a. The secondary of this transformer is connected to the terminals 90a and 91a (FIGURE 1) which are connected to the terminals 93a and 94a, respectively, of the tens transfer circuit 111. The output terminals 856a and 956a of the tens transfer circuit 111 are connected to the input terminals 59b and 60b, respectively, of the register 210. Likewise, the input terminals 93b—94b of tens transfer circuit 211 are connected to the tens transfer output terminals 90b—91b, respectively, of the register 210 and the output terminals 856b—956b of the tens transfer circuit 211 are connected to the input terminals

59c—60c, respectively, of the register 310. Similarly, the input terminals 93c—94c of the tens transfer circuit 311 are connected to the tens transfer output terminals 90c—91c of the register 310 and the output terminals 856c—956c of the tens transfer circuit 311 are connected to the input terminals 59d—60d of the register 410 and in like manner terminals 93d—94d of the tens transfer circuit 411 are connected to the tens transfer output terminals 90d—91d of the register 410 and the output terminals 856d—956d of the tens transfer circuit 411 are connected to the input terminals 59e—60e, respectively, of the register 510.

Because the ordinal series of apertures 53 are effective sequentially with respect to the associated light sensitive cells or tubes 955, 955a, 955b, etc., a sequential transfer from the lower through the higher orders of the accumulator is effected.

A plurality of tens transfer circuits 11, 111, 211, 311 and 411 are connected between the registers as shown in FIG. 1 and each of these tens transfer circuits is the same as the tens transfer circuit shown in FIG. 4a. Consequently each of these tens transfer circuits is provided with a tens transfer resetting switch 855 as shown in FIG. 4a.

RESETTING OR "0" TUBE CONDITIONING CIRCUIT

In order to effect resetting of the accumulator, means is provided to erase any values displayed in the various orders thereof by momentarily disabling all the register tubes, and for subsequently enabling the "0" tubes of each order. At the same time, the transfer circuits are momentarily disabled to prevent false tripping of a tens transfer during the value erasing operation.

The terminals 95—96, 95a—96a, 95b—96b, 95c—96c, 95d—96d and 95e—96e of the registers 10, 110, 210, 310, 410 and 510, respectively, are connected to the battery 15 through an appropriate normally open resetting key switch 14, as shown in FIGURE 1. These terminals are connected to a small light and the primary of a transformer, such as the light 97 and the transformer 98 shown in FIGURE 4. The light 97 is positioned to energize the light sensitive cell or tube 68, as shown in FIGURE 4, and the secondary of the transformer 98 is connected between a second control grid and the cathode of the "0" tube 58. Before the switch 14 is closed in the resetting operation, the tens transfer switches 855 of the tens transfer circuits 11, 111, 211, 311 and 411 must be opened for an instant and just after these tens transfer switch 855 are opened the anode battery switches 13, 113, 213, 313, 413 and 513 must be momentarily opened to remove or erase any values standing in the various ordinal circuits. These switches may be operated as units by means of suitable mechanical linkages of conventional design.

When the light sensitive cell or tube 68 is energized by the light 97 upon closing of the resetting key switch 14, the circuit of the zero tube 58 is conditioned for operation since energizing this light sensitive cell or tube greatly reduces the resistance of this cell or tube and increases the plate voltage applied to the plate of the tube 58 from the battery 12 connected to the terminal 92 and the conductor associated therewith. At the same time as the plate voltage applied to the tube 58 is increased in this fashion, the voltage applied across the glow lamp 72 is increased but not sufficiently to ionize the gas in this glow lamp. However, a positive voltage pulse is applied to the auxiliary control grid of the tube 58 with respect to the cathode of this tube from the secondary of the transformer 98 since this transformer is connected to the battery 15 and key 14 and this pulse fires the tube 58 thereby increasing the current through this tube sufficiently to ignite or ionize the gas of the glow lamp 72. Ionization of the glow lamp 72 illuminates the character "0" associated therewith. Accordingly, the "0" tube 58 and associated glow lamp 72 of the register 10 and corresponding "0" tubes and associated glow lamps in each of the registers 110, 210, 310, 410 and 510 are conditioned for operation when the key 14 is closed and the glow lamps associated with the "0" tubes cause each of the aforesaid registers to indicate zeros.

REGISTER OPERATION

The operation of the circuit shown in FIGURE 4 will now be described. The registers 10, 110, 210, 310, and 410 and 510 have zeros entered therein as outlined above in the description relating to the "0" tube conditioning or resetting circuit and the zero tubes of these registers corresponding to the tube 58 of register 10 are in conducting or ignited condition. This resetting operation is effected by operation of the key switch 14. Just prior to the closing of switch 14, all the switches 13, 114, 213, 313, 413 and 513, and switches 855, 855a, 855b, 855c, 855d and 855e are opened and closed to de-energize any energized register tubes and to disable the tens transfer circuits. Furthermore, switches 85, 855a, 855b, 855c, 855d and 855e are opened just prior to the opening of the switches 13, 113, 213, 313, 413 and 513 to prevent storing of a tens transfer pulse. Of course these switches 13, 113, 213, 313, 413 and 513 and switches 855, 855a, 855b, 855c, 855d and 855e are closed shortly after being opened so that these switches are closed when switch 14 is closed in the resetting operation.

With the "0" tube of the ordinal circuits in firing condition, an impulse fed to the input terminals 59—60 of the register 10, for example, will fire the No. 1 tube 57 since the light from the ignited "0" tube 58, being directed to the light sensitive tube or cell 67, connected in series with this tube 57, has conditioned the plate circuit of this tube for firing of the tube. The electric pulse applied between the grid and cathode of the tube 57 therefore renders this tube conductive or substantially increases its conductivity and the increased plate current ionizes the glow tube 71 which is associated with the character "1" of the register 10 and illuminates this character. Simultaneously the light from the ionized gas of the tube 57 or the light from the fluorescent coating provided in this tube, is directed to the quenching light sensitive tube or cell 64, connected from the plate to the cathode of the "0" tube 58. This quenching tube or cell 64 and other similar tubes or cells 63, 62 and 61 in the register 10 and similar tubes or cells in registers 110, 210, 310, 410 and 510 may be resistance type light responsive cells adapted to decrease in resistance by a substantial factor when illuminated or they may be gas type light sensitive tubes the gases in which are ionized by the potentials across them when the tubes are illuminated. Therefore, when the quenching cell or tube 64 is illuminated it functions because of its greatly lowered resistance to shunt the thermionic tube 58 and bleed off the current flowing through the tube 58 with the result that the tube 58 does not receive sufficient current to maintain its ionized condition and is quenched.

As described above, the glow discharge from the tube 58 illuminates the light sensitive tube or cell 67 and primes the thermionic tube 57 so that a pulse applied to the terminals 59 and 60 is received by the "1" tube 57 and fires or renders this tube conductive. The light from the glow discharge of this tube 57 is received by the quenching tube or cell 64 of the thermionic tube 58 so that the latter tube is quenched. Light from the tube 57 is also received by the light sensitive tube or cell which primes the No. 2 tube (not shown) connected to this tube in the same manner as the light sensitive cell or tube 67 is connected to the No. 1 tube 57. Likewise, when a second pulse energizes the No. 2 tube the glow discharge from this tube energizes the light sensitive quenching tube or cell 63 which functions as a quenching circuit for the tube 57 and also primes the circuit of the No. 3 tube so that the third pulse received by the input circuit is applied to the input of the No. 3 thermionic tube. Successive pulses applied to the input terminals 59 and 60 will cause the No. 4, No. 5, No. 6, No. 7, No. 8 and No. 9 tubes to fire or become conductive successively and the light from the No. 4 tube functions to quench the No. 3 *tube*, that from the No. 5 tube quenches the No. 4 tube, the light from the No. 6 tube quenches the No. 5 tube, the light from the No. 7 tube quenches the No. 6 tube, the light from the No. 8 tube 56 quenches the No. 7 tube, and the light from the No. 9 tube 55 falls on the cell or tube 62 to quench the tube 56 and the light from the No. 9 tube 55 also falls on the tube or cell 68 of the "0" tube 58 to enable this "0" tube for reception of the next pulse applied to the terminals 59 and 60.

OPERATION OF TRANSFER CIRCUIT

The transfer circuit 11 connected to the terminals 90 and 91 of the register 10 functions when the No. 9 tube 55 is quenched as a result of the input circuit of the register 10 receiving a tenth pulse, to apply a pulse to the input circuit of the next higher order register 110. The transfer circuit 11 receives the pulse from the transformer 455 and stores this pulse in the capacitor 755 for application to the input of the next higher order register 110. The rectifier 555 is connected in such manner that only the decaying current in the primary of the transformer 455 induces an E. M. F. into the secondary of this transformer of the proper polarity to pass a current through the rectifier 555 and charge the capacitor 755. Thus this capacitor 755 is charged when the No. 9 tube 55 is quenched, that is, when the current through the primary of the transformer 455 decays. However, if the No. 9 tube 55 is energized when the resetting key 14 is operated to recondition the circuit or set it to zero no transfer impulse will be stored because the switch 855 is opened to disable the transfer circuit before the switch 13 is opened so that the capacitor 755 is not charged at this time.

REGISTER IN WHICH SEPARATE GLOW TUBES ARE ELIMINATED

With the provision of fluorescent coatings inside of the register thyratrons or thermionic devices 55, 56, 57 and 58 of FIGURE 4, 55a, 56a, 57a and 58a of FIGURE 4a, etc., it is apparent that the function of illumination of the legends, numerals and the like associated with the glow lamps 69, 70, 71 and 72 of FIGURE 4 and 69a, 70a, 71a and 72a of FIGURE 4a, respectively, may be performed by the register thyratrons or thermionic devices 55, 56, 57 and [48] *58* of FIGURE 4 and 55a, 56a, 57a and 58a of FIGURE 4a, respectively, since sufficient light will be given off by these thyratrons for such illumination. These glow lamps 69, 70, 71 and 72 of FIGURE 4 and 69a, 70a, 71a and 72a of FIGURE 4a together with resistors 269, 269a, 270, 270a, 271, 271a, 272 and 272a and capacitors 369, 369a, 370, 370a, 371, 371a, 372 and 372a of FIGURES 4 and 4a may therefore be eliminated if desired. The plate current supplies for the thyratrons in these figures may be connected by shorting the glow lamps, that is, by removing the glow lamps completely and connecting the thyratron plate current supply directly to the anodes of the enabling light responsive device 65, 65a, 66, 66a, 67, 67a, 68 and 68a of FIGURES 4 and 4a.

Figure 5:
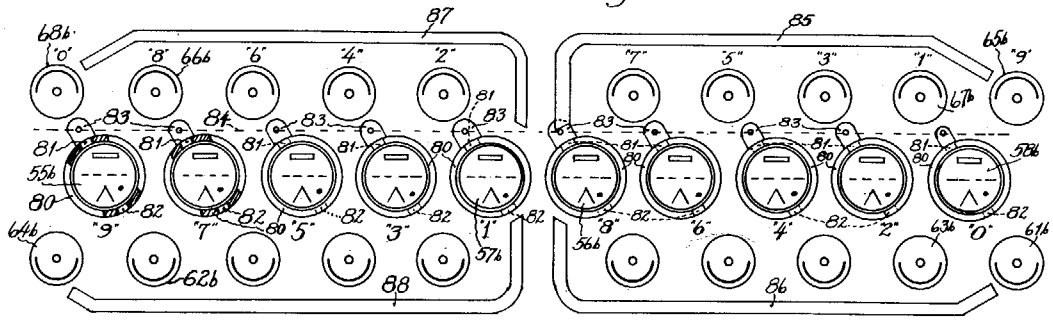
FIGURE 5 is a schematic plan view illustrating an arrangement of register tubes which are reversible.
Figure 4B:
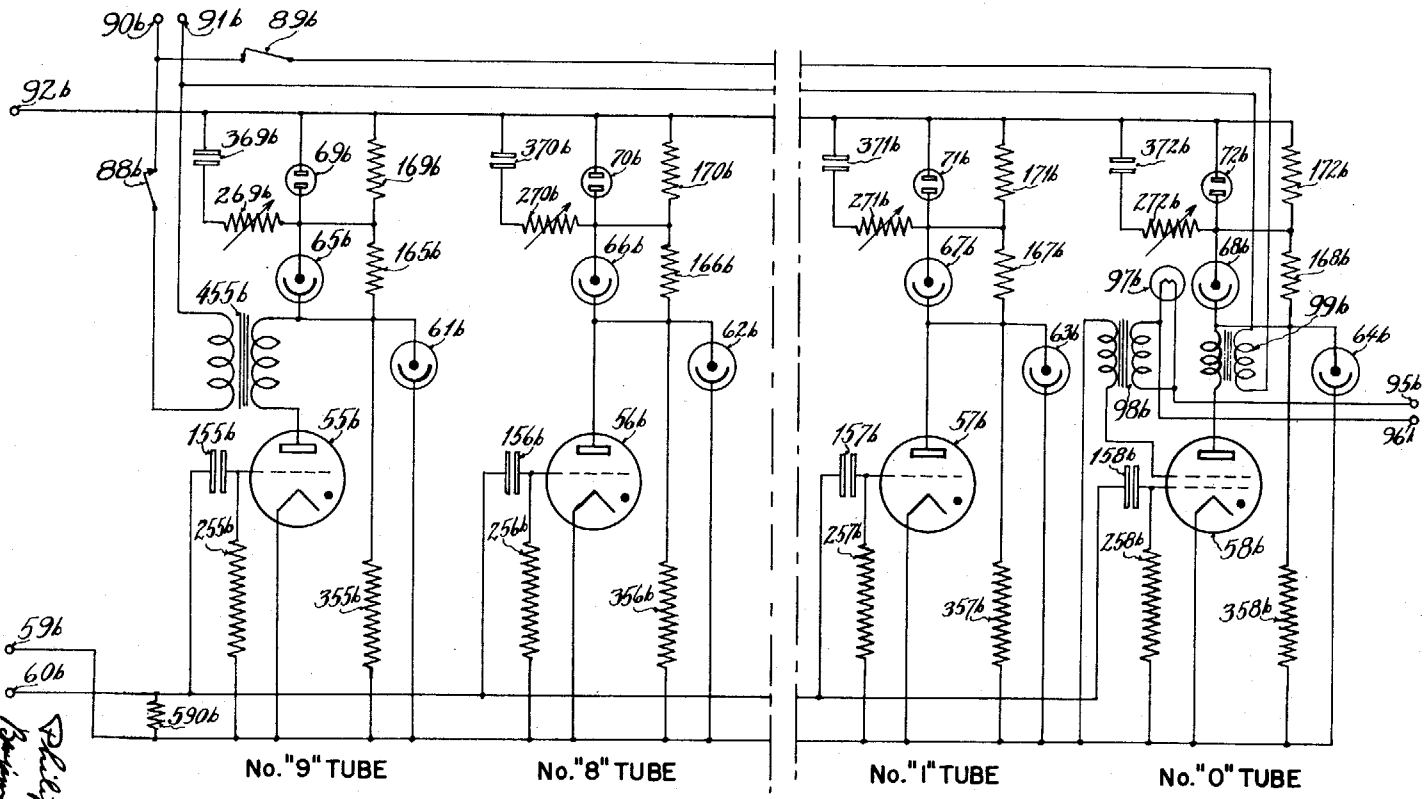
FIGURE 4b is similar to FIGURE 4 but illustrates a modified form of the invention.

The circuit diagram for an ordinal portion of the register of a reversible character, as illustrated in FIGURE 5, is shown in FIGURE 4b which is similar in all respects to the circuit of FIGURE 4 with the exception that provision is made for transferred increments or pulses during both negative and positive operation.

It will be recalled in connection with the circuit shown in FIGURE 4 that the transfer signals or pulses from one order of the register to the next order are obtained from the decay of the current through the No. 9 tube 55b, through the transformer 455b. Similarly, for negative transfer signals or pulses, a transformer 99b is incorporated in the plate circuit of the No. "0" tube 58b to provide a transfer pulse upon decay of this circuit. Both the transformers 455b and 99b are connected in parallel to the output terminals 90b and 91b with the provision of respective control switches 88b and 89b, respectively, to enable the desired transfer circuit in accordance with the character of the operation being performed. For example, when the register is set for addiiton, the switch 88b is closed and the switch 89b is open, so that only positive transfer pulses will be transmitted to the next higher order register circuit. Conversely, in subtraction, the switch 89b is closed and the switch 88b is open so that only subtractive transfer pulses will be permitted during the substracting operation.

MODIFIED REGISTER CIRCUITS

The register 10 consisting of the tubes 55, 56, 57 and 58 may be connected as shown in FIGURE 4, however, modified circuit diagrams such as shown in FIGURES 4c, 4d and 4e may be employed if desired and in each of of these figures the elements having functions corresponding to the elements shown in FIGURE 4 are designated by corresponding reference numerals except that in FIGURE 4c the reference numerals are provided with a suffix "c," and in FIGURE 4d, the elements are provided with the suffix "d," and in FIGURE 4e, they are provided with a suffix "e." In FIGURE 4c, two tubes 58 and 57 of the thyratron tube corresponding to tube 58 and 57 of FIGURE 4 are shown, whereas in FIGURE 4d only one tube 58d corresponding to tube 58 in FIGURE 4, and in FIGURE 4E one tube 58e likewise corresponding to tube 58 of FIGURE 4, are shown.

Referring to FIGURE 4c in detail, light responsive device 68c is energized by a suitable light source in a manner previously described in the description of corresponding light sensitive devices in FIGURES 4, 4a and 4b, and the impedance of this light responsive device 68c is decreased so that the current through this device, the resistors 172c and 272c and the device 58c is increased. The potential drops across these resistors are therefore increased and the charge of the capacitor 372c is also increased. The circuit of the thyratron or gas discharge tube 58c is thus enabled since the plate potential of this tube is increased. A positive electrical pulse or wave applied to the grid of the tube 58c fires or triggers this tube and causes the potential across this tube to ionize the gas and the small quantity of mercury therein so that the fluorescent coating therein is energized and the fluorescent light therefrom illuminates another light responsive device such as device 67c for enabling the circuit of another thyratron 57c. At the same time the fluorescent light from the thyratron 58c illuminates a quenching cell corresponding to cell 64c for quenching or extinguishing another thyratron that was energized prior to the energization of thyratron 58c. With the firing of the thyratron 58c the impedance thereof decreased so that the current therethrough increased and accordingly the current through the light responsive device 68c increased since the potential thereacross increased. However, the same pulse as was used to trigger the thyratron 58c also triggered the gas glow tube 72c since the trigger electrode thereof is connected to the grid of the thyratron through the current limiting resistor 72x. The glow tube 72c is thus energized and caused to glow by the discharge of the capacitor 372c therethrough and by some of the current flowing through the thyratron 58c. The glow tube 72c thereby illuminates the numeral character or other legend associated therewith.

The light from the ionized gas or energized fluorescent coating in the thyratron 58c enables the circuit of another thyratron 57c by illuminating the light responsive device 67c so that the next electrical pulse or wave applied to the input grid-cathode circuit of the thyratrons triggers this thyratron 57c and the light from the ionized gas or energized fluorescent coating in this latter thyratron illuminates the enabling light responsive device of the third thyratron and the light responsive quenching device 64c associated with thyratron 58c. The light responsive quenching device 64c bleeds off the current from the light responsive device 68c and the thyratron 58c thereby quenching the ionization in these devices.

In the apparatus shown in FIGURE 4d, the tube 58d of the thyratron type is provided with five electrodes, namely, a cathode, a control grid, a second control grid, an anode and a cutoff grid positioned between the anode and the second control grid. The anode of the tube 58d is connected to one terminal of the light sensitive enabling device 68d and the other terminal of this light sensitive device is connected to one terminal of the glow lamp 72d. The other terminal of the glow lamp 72d is connected to the positive busbar which is connected to the terminal 92d. The control grid of the tube 58d is connected to the signal input line coupling capacitor 158d and to the grid resistor 258d. The auxiliary control grid of the tube 58d is connected to the secondary of the transformer 98d, the primary of this transformer being connected to the terminals 95 and 96. A small lamp 97d for energizing the light sensitive device 68d is also connected to the terminals 95 and 96.

The operation of this register arrangement is similar to that of the register arrangement shown in FIGURE 4. However, in this case the quenching or cutoff light sensitive device 64d is connected in series with the entire voltage divider consisting of the series-connected resistors 172d, 168d and 358d which are connected between the positive busbar and the cutoff grid of the tube 58d. The cutoff grid of the tube 58d is connected to one terminal of the light sensitive device 64d and the other terminal of this device is connected to the cathode busbar. The resistor 172d is also connected across the glow lamp 72d; resistor 168d is connected across the light sensitve device 68d and resistor 358d is connected between the anode and cutoff grid of the tube 58d. Consequently, when the light sensitive device 64d is energized for quenching or cutoff purposes, the potential on the cutoff grid of the tube 58d is substantially reduced so that the ionization of the gas inside of the tube 58d is quenched. The impedance of this tube, therefore, increases immediately after the quenching device 64d is energized and as a result the gas in the tube 72d is also deionized.

The function of the device 72d is the same as the function of the device 72 in FIGURE 4 and as previously described these functions may be combined into the function of the thyratron 58d, particularly where this thyratron is provided with a fluorescent coating therein as described above.

In FIGURE 4e the thyratron tube 58e which corresponds to the thyratron tube 58 in FIGURE 4 is provided with a cutoff electrode between the cathode and the control grid and this cutoff electrode is connected to the anode through the light sensitive quenching device 64e. In this case when the light senesitive device 64e is energized the space between the cutoff electrode and the anode is shunted by a low impedance path of the energized device 64e, and in this manner, the tube 58e is deionized.

The modified form of this register shown in FIGURE 4e also shows the register circuit in which the glow lamp corresponding to the glow lamp 72 has been eliminated and in this case the resistor 168e corresponding to the resistors 168 and 172 of FIGURE 4 is connected to the positive busbar. The light sensitive enabling device 68e corresponding to the device 68 of FIGURE 4 is connected between a variable contactor associated with the resistor 68e and one of the terminals thereof. This circuit illustrates the manner in which the components may be connected when the glow lamps corresponding to glow lamp 72 of FIGURE 4 are eliminated. Likewise, in FIGURES 4c and 4d the glow lamps 72c and 72d, respectively, may be eliminated and the function thereof incorporated in the functions of the tubes 58c and 58d.

From the above description it will be seen that the light from a fired gaseous discharge tube will illuminate effectively the priming phototube for the next digital value and also the quenching phototube for the previously fired tube in the original series of tubes.

FIGURE 5 illustrates a modified reversible form of ordinal registering circuit in which the thyratron corresponding to a particular numeral, say the number "0," can be associated to enable either the thyratron corresponding to the number "1" for addition or the thyratron corresponding to the number "9" for subtraction in response to the same character of electrical impulse. To obtain this end the ten thyratrons of a registering circuit are arranged in two groups of five, one group comprising the tubes representing even numbers, that is, the tube 58b, 56b, etc., while the other group would comprise the tubes representing the odd numbers, that is, the tubes 57b and 55b corresponding to the numbers "1" and "9," etc. Associated with each of the tubes 55b through 58b, etc., is a pivotally mounted shutter 80 having diametrically opposed openings 81 and 82 therein. Each cylindrical shutter 80 is provided with an ear 83 which is pivotally connected to a common operating link diagrammatically illustrated at 84 so that all of the shutters 80 can be adjusted as a unit through equal angular extents.

Referring to the right-hand portion of FIGURE 5, the "0" tube 58b has grouped at the left side thereof the enabling and quenching light sensitive tubes 67b and 63b, respectively, for the No. 1 tube 57, and at the right side thereof the enabling and quenching tubes 65b and 61b for the No. 9 thyratron 55b. Correspondingly, the enabling tube 67b and the quenching tube 63b for the No. 1 tube 57 are to the right of the thyratron corresponding to the No. 2.

The No. 8 tube 56b has associated with it at the right the enabling and disabling tubes for the "7" thyratron. To provide for association of the "8" tube 56b with the enabling tube 65b and the disabling tube 61b for the "9" tube or thyratron, a pair of light-transmitting rods 85 and 86 are each positioned with one end for cooperation with the openings 81 (or 82) of the shutter 80 for the tube 56b, and with the other end adjacent the light responsive tube 65b or 61b, respectively. The rods 85 and 86 may be formed of a methyl methacrylate plastic such as "Lucite" or "Plexiglas."

Referring to the left-hand portion of FIGURE 5 containing the thyratrons corresponding to the odd numbered numerals, it will be noted that the enabling tube 68b and the quenching tube 64b for the thyratron 58b corresponding to the No. "0" are to the left of the "9" tube 55b and the enabling tube 66b and quenching tube 62b for the No. 8 tube 56b are to the right of the "9" tube 55b. The No. 1 thyratron 57b has to the left of it the enabling and quenching tubes for the No. 2 tube and is connected through light-transmitting rods 87 and 88, respectively, with the enabling and quenching tubes 68b and 64b, respectively, for the "0" tube 58b.

As shown in the drawings, the shutters 80 are adjusted for additive operations of the circuit, that is the shutter 80 about the "9" tube 55b is so adjusted that when the tube 55b is firing the enabling tube 68b for the No. "0" circuit is illuminated and the disabling tube 62b for the No. 8 circuit is illuminated. Thus, the next impulse received would result in a change of registration from "9" to "0" if the circuit is standing at "9." If the shutter 80 is rotated clockwise 60° from the position shown in FIGURE 5 so that the openings 81 and 82 therein are aligned with the quenching tube 64b for the "0" thyratron and the enabling tube 66b for the "8" thyratron, then the ordinal registering circuit is set for subtractive operation. It will be understood that the shutters 80 for all of the thyratrons are adjusted similarly for either addition or subtraction. Also the various ordinal registering circuits have their links 84 joined so that the entire register would be set for additive or subtractive operation at the same time.

In this connection a modified transfer circuit is provided as explained in connection with FIGURE 4b so that the switch 88b is closed, and switch 89b is open for additive registrations, and the switch 88b is open and the switch 89b is closed for subtractive operations, and these can be operated in each order in unison with the operation of the positive and negative control links 84.

If desired, known forms of electronic counting circuits may be employed as the ordinal register of the instant invention. For example, the circuit disclosed in the United States Patent to Michel, No. 2,310,105, issued February 2, 1943, may be employed by using ten tubes in his circuit as described in the patent, and by employing a tens transfer circuit as disclosed herein. Also, counting circuits of the character described by C. E. Wynn-Williams at pages 295–310 of volume A132 (1931) of Proceedings of the Royal Society, may also be used herein as pointed out in connection with the Michel patent.

MODIFIED LIGHT SELECTION MECHANISM

Figure 6:
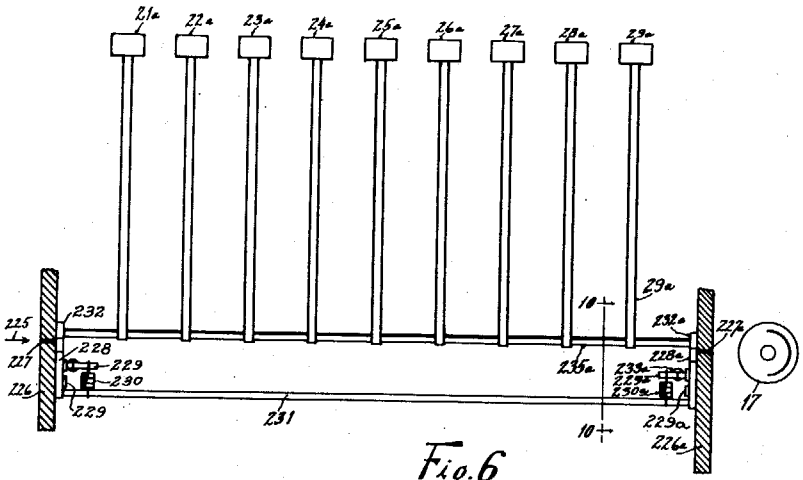
FIGURE 6 is a schematic sectional view of one order of a key operated type selection mechanism.
Figure 7:
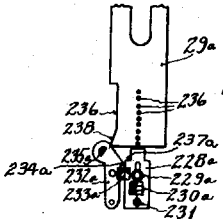
FIGURE 7 is a fragmentary elevational view of the mechanism shown in FIGURE 6 being taken as indicated by the line 10—10 in FIGURE 6.

Referring to FIGURES 6 and 7, there is illustrated schematically a modified form of light ray or beam selection mechanism wherein a single differentially apertured drum is utilized to provide the desired selected light rays or pulses to the various orders of the selection mechanism. Referring to the drawing, there is illustrated at 125, a cylinder or drum which may be journaled in bearings 126 and driven through a conventional type half-revolution clutch 127 from a suitable source of power, such as an electric motor, not shown. The drum 125 is provided with two similar sets of diametrically opposed apertures 128, 128a, 128b, 128c, etc., through 128j, respectively, providing a representation of the numbers from 1 to 9 and providing a transfer light pulse by means of the aperture 128j. Associated with the drum 125 is a tubular source of light 129, such as a neon or fluorescent tube, so as the drum 125 rotates in the direction of the arrow, the various rows of apertures will provide a corresponding number of light pulses or rays during each half revolution.

Associated with the drum 125 and disposed oppositely with respect to the light source 129, are a series of optical reflecting elements 130, 130a, 130b and 130c representing four orders of the selection mechanism. While these reflecting elements or mirrors are shown schematically in FIGURE 6, in practice, they would be mounted at the end or at some convenient position upon a keyboard selection slide or bar of the type shown in the patent to Harold T. Avery, No. 2,229,630, issued January 28, 1941. The position of the reflecting elements shown in FIGURE 6 is the inactive position and upon operation of the associated slides by means of the numeral keys the respective mirrors would be translated axially of the drum 125 into alignment with the row of apertures corresponding in number to the value of the depressed numeral key. Preferably, also the mirrors 130 to 130c would be staggered vertically, that is, perpendicular to the plane of the drawing, so that when the mirrors are adjusted in alignment with the same row of apertures each mirror will receive the light rays therefrom.

In order to transmit the light pulses from each order of the selection mechanism selectively to various orders of the register they are provided in alignment with the mirrors 130 through 130c, respectively, a second set of reflecting elements or mirrors 131 through 131c, respectively, which cooperate with the mirrors 130 through 130c, respectively, and a multiple reflecting unit 132 illustrated in greater detail in FIGURE 7, as including the reflecting elements or mirrors 132 through 132c, respectively. The arrangement is such that light rays from the mirror 130, for example, are transmitted to the mirror 131 and then to the mirror 132, which in turn, reflects the light ray to one of the series of light responsive cells or tubes 17, 117 or 217, respectively, depending upon the rotatively adjusted position of the unit 132. In effect the rotative adjusted position of the multiple reflecting unit 132 corresponds to the carriage position of a shiftable carriage machine in that it changes the ordinal relation of the selection mechanism to the accumulator. Thus, as shown, there are four orders in the selection mechanism corresponding to the mirrors 130 through 130c and the plurality of light impulses or beams from these mirrors as selectively positioned with respect to the selection drum are transmitted in a definite ordinal pattern to the register in accordance with the rotative adjusted position of the multiple reflecting unit 132. As shown, the unit 132 is so adjusted that the light from the mirrors 130 and 131 would be reflected to the light sensitive device 217. This adjustment is determined by the position of the adjusting rack 133 which meshes with a pinion 134 carried by the unit 132. Suitable manual control devices such as keys may be associated with the slide 133 to effect the adjustment thereof, and these manual control keys would correspond in function to the carriage shift or tabulating control keys as disclosed for example, in the patent to Webb 2,216,636, issued October 1, 1940.

Similarly, the light rays from the mirrors 130a and 131a would be transmitted to the mirror 132a and thence to the associated one of the light sensiitve devices 117, 217, etc.

In this manner, any selected number of light impulses can be transmitted selectively to the various orders of the register as represented in the [instance] *instant* case by the light sensitive devices 117, 217, etc.

In order to provide for successive light impulses to the ordinal transfer means, there is provided a series of transfer actuating light sensitive devices 134 through 134e (corresponding to the devices 955, 955a, etc., of FIGURE 1) which are vertically staggered and are in alignment axially of the drum 125 with the aperture 128j so that each of these light sensitive devices receives one light impulse during each half rotation of the drum 125.

The calculating machine is also provided with a revolutions or item counter for performing the usual counting functions in such machines and the counter is of the same electronic character as disclosed in connection with the accumulator or total register. The drum 125 and its light impulse mechanism is also utilized to actuate the revolution or item counter mechanism by means including a rotatively adjustable mirror unit 135 in alignment with the opposite apertures 128 of the drum so that for each half rotation of the drum 125 one light pulse is received on the mirror unit 135 which may consist of a single mirror 132, for example. The mirror unit 135 is adjusted in accordance with the selected ordinal position of entry of the values in the accumulator in the usual fashion and may be connected through geraing 136, 136a and 136b to the rack 133 so that ordinal position of entry of the light pulses into the revolutions counter actuating light sensitive devices 137 through 137c is controlled simultaneously with the ordinal position of entry of the light pulses into the accumulator or main register previously described. It will be understood that the light sensitive devices 137 through 137c in their relation to the revolutions counter correspond to the light sensitive devices 17 through 417 in their relation to the accumulator.

In other respects, the registering circuits associated with the light sensitive devices 137 through 137c is similar in all respects to the registering circuits shown in FIGURES 4, 4a, 4b, etc.

KEY-OPERATED LIGHT CONTROLLED SELECTION MECHANISM

FIGURES 6 and 7 illustrate somewhat schematically, one order of the selection mechanism of a key-operated type register or calculator including a series of value keys 21a through 29a, representing the values from "1" through "9," respectively. These keys are mounted in general, similarly to the keys 21 through 29, with the exception that no latching mechanism is associated therewith.

Cooperating with the value keys 21a through 29a is a source of light 225 indicated by an arrow, and a light responsive device 17 of the character previously described. Interposed between the light source 225 and the light responsive device 17 are a pair of plates 226 and 226a having aligned apertures 227 and 227a therein located immediately below the lower ends of the keys 21a through 29a. The aperture 227 is normally closed by means of a shutter or slide 228 which is mounted for vertical sliding movement by a pair of studs 229 on the plate 226 and is urged to its upper position by a spring 230. The spring 230 is tensioned between an extension of one of the studs 229 and a rod 231 which connects the shutter 228 and a similar shutter 228a on the plate 226a to provide common movement thereof.

The shutters 228 and 228a are identical in construction and have similar parts associated therewith in controlling the shutters' action with respect to the various keys as will be apparent from the following description. The shutters are adapted to remain in light ray intercepting position during the downward stroke or movement of one of the keys and to be latched in inactive or light passing position during the upward stroke or movement of the key. For this purpose, a latch pawl 232 is associated with the shutter 228 and a similar latch pawl 232a is associated with the shutter 228a. The latch pawl 232a, for example, is urged by an associated spring 233a so that its tooth 234a is urged toward latching engagement with the shoulder 237a of the associated shutter. In the raised position of a key, the shoulder 237a as shown in FIGURE 7, is positioned above the tooth 234a. However, upon depression of the shutter 228a by engagement of an associated key, for example, the key 29a, with the rod 231 the pawl 232a can snap clockwise, as viewed in FIGURE 7, to latch the shutter 228a in depressed position so that as the key 29a is raised the nine aligned apertures 236 thereof will provide nine light ray impulses from the light source 225 to the light responsive device 17. The operation with the other value keys is similar with the exceptiion that they have from one to eight apertures, respectively, in accordance with their values.

Toward the end of the return stroke of the key 29a its cam surface 238 will engage the rod 235a connecting the respective latching pawls 232 and 232a to release the shutters 228 and 228a and allow them to return to light intercepting position after travel of the lowermost aperture 236, past the apertures 227 and 227a and before the lower end of the key has raised into alignment with the apertures so that no undesired light will be transmitted.

SUMMARY OF OPERATION

The operation of a type of light ray selection mechanism and light control register mechanism will be summarized briefly assuming, for example, that successive additions of two single digit numbers, for example, 8 and 3, are to be made in successive cycles of the machine.

Referring first to FIGURE 2, to enter the value 8 in an order of the selection mechanism, the numeral key 28 is depressed so that 8 of the mirrors 36 are placed in active position to receive light rays from the apertures 44 through 51, inclusive. To further condition the machine as to the ordinal position of entry of this value, assuming for example, it is wished to transfer the value from the units order of the selection mechanism to the units order of the register, the light source associated with the light sensitive devices 18, 19 and 20, is energized so that the tube 18 can become conducting whenever the associated tube 17 is rendered conducting.

To insure proper conditioning of the register to receive the value, the resetting mechanism is operated including opening momentarily of the switches 13, 113, 213, etc., and the prior opening of the switches 855, 855a, etc., of the transfer circuits and thereafter closing of the resetting control switch 14. The opening of the switches 13, 113, 213, etc., serves to break the plate circuit to the thermionic tubes of the registering circuits so that any tube which has been previously rendered conducting is quenched and any value standing in the various orders of the register will be erased. At the same time, the opening of the switches 855, 855a, etc., in the transfer circuits prevents entry or tripping of a false transfer by virtue of the decay of the current in any register circuit which might have been standing at nine, i.e., having its tube 55 energized.

The closing of the resetting switch 14 energizes the lights 97, 97a, etc., associated with the enabling light sensitive devices 68, 68a, etc., of the "0" tubes 58, 58a, etc., and at the same time, places a relatively positive potential on the auxiliary control grid of the zero tubes so that these tubes are rendered conducting and the light register stands at zero.

With the above operations performed, the machine is conditioned for entry of a value, namely, the value 8 in the units order of the register. Thereafter, the drive for the drum 41, FIGURE 2, is enabled by conventional means so that the drum performs one-half revolution and the ray of light collimated by the apertures 43 of the drum sweeps past the apertures 44 through 51, inclusive, and light rays are reflected by the mirrors 36 associated with these apertures to the associated light responsive tube 17, this tube being rendered conducting along with the tube 18, FIGURE 1, in series therewith to place a number of positive pulses corresponding to the light rays upon the input terminals 59 and 60 of the units registering circuit 10.

It will be recalled that the "0" tube 58 (FIGURE 4) of this registering circuit is active or firing so that the light from this tube or from an associated circuit element of the tube, impinges upon the light sensitive device 67 in the plate circuit of the No. 1 tube 57 enabling this tube. As a result, the first pulse received will cause firing of the tube 57 and when this tube is illuminated the light therefrom is caused to impinge upon the quenching tube 64 of the No. "0" tube 58 to quench the operation. At the same time, the light from the tube 57 impinges upon the enabling light sensitive tube for the No. 2 tube (not shown) so that this tube will respond to the second pulse, this operation continuing until the No. 8 tube 56 is energized and the entry of this digit is completed.

Subsequently, to enter the value 3 in the units order of the keyboard, the key 23 is depressed which releases the previously adjusted mirrors under the control of the key 28 and only retains three of the mirrors 36 in active position. The proper controls are then again operated to cause a half revolution of the drum 41 so that three of the rays become effective on the light sensitive cell 17 and three electrical impulses are impressed upon the terminals 59 and 60 of the registering circuit 10.

It will be recalled that the register has the No. 8 tube 56 firing so that the first pulse will cause firing of the No. 9 tube 55 and the third pulse will cause firing of the tube 57 and quenching of the tube 58 so that the units register circuit will display "one."

It will be recalled that decay of the current in the plate circuit of the No. 9 tube 55 operates through the transformer 455 to impress a pulse through the output terminals 90 and 91 (FIGURE 4) onto the transfer circuit, shown in FIGURE 4a, to charge the capacitor 755 and condition the lowest order transfer circuit for providing a single pulse input to the tens order register circuit 110. It will also be recalled that as the drum 41 (FIGURE 2) rotates a light ray is transmitted through the aperture 53 to impinge upon the transfer actuating light sensitive cell 955 after the entry of digitation pulses into the units order register. When the cell 955 (FIGURE 4a) is illuminated the capacitor 755 discharges to apply an input pulse to the terminals 59a and 60a of the tens order register circuit 110. During the previous operations the register circuit had been standing at zero so that the single pulse input will enable the No. 1 tube 57a and quench the zero tube 58a so that at the end of the operation the tens order register circuit 110 also displays the number 1 so that the number 11 is displayed as the sum of the digits 8 and 3.

To perform subtracting operations with circuits of the character shown in FIGURES 4 and 4a, complemental addition is used in the well-known fashion in entering the values in the keyboard. However, with the type of circuit shown in FIGURE 4b, direct subtraction can be performed in the same manner as addition.

We claim:

1. In a registering apparatus having an ordinal register responsive to electrical impulses and ordinal selection mechanism for supplying impulses to the register, means for controlling the ordinal position of the entry of impulses by said selection mechanism in said register including a plurality of rows of light sensitive devices respectively connecting said register and said mechanism in various ordinal relations, and selective means for enabling a row of said light sensitive devices.

2. In a registering apparatus having an ordinal register responsive to electrical impulses and ordinal selection mechanism for supplying impulses to the register, means for controlling the ordinal position of the entry of impulses by said selection mechanism in said register including a plurality of groups of light sensitive devices, each group providing a given ordinal relation between said register and said mechanism, and selective means for enabling said groups.

3. An ordinal register comprising a series of electric discharge means corresponding to the values from "0" to "9," a light sensitive device associated with each of said means for conditioning the associated means for operation and operatively related to be controlled by another of said electric discharge means, and a second light sensitive device associated with each of said means to interrupt the operation thereof and operatively related to another of said means to operate under control thereof, whereby energization of any of said means operates a light sensitive device to condition another of said means for operation and operates a second light sensitive device to quench operation of a third of said means.

4. An ordinal register comprising a series of electric gas discharge tubes corresponding to the values from "0" to "9," light responsive means associated with each of said tubes for conditioning the associated tube for operation and operatively related to receive light from another of said tubes, and second light responsive means associated with each of said tubes to interrupt the operation thereof and operatively related to another of said tubes to receive light therefrom whereby energization of any of said tubes operates light responsive means to condition another of said tubes for operation and operates a second light responsive means to quench operation of a third one of said tubes.

5. An electrical circuit comprising a series of electric gas discharge tubes, light responsive means associated with each of said tubes for conditioning the associated tube for operation and operatively related to receive light from another of said tubes, and second light responsive means associated with each of said tubes to interrupt the operation thereof and operatively related to another of said tubes to receive light therefrom whereby energization of any of said tubes operates light responsive means to condition another of said tubes for operation and operates a second light responsive means to quench operation of a third one of said tubes.

6. A reversible registering apparatus including a series of electric discharge devices corresponding to the numbers from "0" to "9," a light sensitive means connected in enabling relation with each of said devices, a second light sensitive means connected in disabling relation with each of said devices, and means for selectively switching the respective associations of said means with said devices to enable additive and subtractive registration by said discharge devices.

7. A registering circuit comprising a series of thermionic devices, two corresponding series of light sensitive devices associated therewith for operation under control of light caused by firing of said thermionic devices, means connecting one series of said light sensitive devices selectively to said thermionic devices to enable operation thereof and means connecting the other series of said light sensitive devices selectively to said thermionic devices to quench operation thereof.

8. A registering circuit comprising a series of thermionic devices, two corresponding series of light sensitive devices associated therewith for operation under control of light caused by firing of said thermionic devices, means connecting one series of said light sensitive devices selectively to said thermionic devices to enable operation thereof, means connecting the other series of said light sensitive devices selectively to said thermionic devices to quench operation thereof, and a common input for controlling operation of said thermionic devices in response to electrical signals applied to said circuit.

9. A registering circuit comprising a series of thermionic devices, two corresponding series of light sensitive devices associated therewith for operation under control of light caused by firing of said thermionic devices, means connecting one series of said light sensitive devices to enable said thermionic devices for operation, means connecting the other series of said light sensitive devices to quench operation of said thermionic devices, said light sensitive devices controlling operation of said thermionic devices in response to electrical signals applied to said circuit, and means for reversing the control of said light sensitive devices to reverse the direction of operation of said thermionic devices in response to the same character of electrical signals.

10. A registering circuit comprising a series of thermionic devices and two corresponding series of light sensitive devices associated therewith for operation under control of light caused by firing of said thermionic devices, one series of said light sensitive devices being electrically and selectively connected to enable said thermionic devices for operation and the other series of said light sensitive devices being electrically and selectively connected to qeunch said thermionic devices, and means for selectively applying said light from each of said thermionic devices to different light sensitive devices of said respective series.

11. A registering circuit comprising a series of thermionic devices, a series of light sensitive devices operatively related to said series of thermionic devices with each of said light sensitive devices arranged to receive light from an associated one of said thermionic devices and electrically connected to condition another of said thermionic devices for operation.

12. A registering circuit comprising a pair of thermionic devices, a light sensitive device operatively related to said thermionic devices arranged to receive light from one of said thermionic devices and electrically connected to condition the other of said thermionic devices for operation.

13. A registering circuit comprising a pair of thermionic devices, a pair of light sensitive devices operatively related to said pair of thermionic devices, one of said light sensitive devices being arranged to receive light from one of said thermionic devices, means connecting said one light sensitive device to condition the other of said thermionic devices for operation, the other of said light sensitive devices being arranged to receive light from the other of said thermionic devices, and means connecting said other light sensitive device to quench operation of said one thermionic device.

14. A registering circuit comprising a series of thermionic devices, a series of light sensitive devices operatively related to said series of thermionic devices with each of said light sensitive devices arranged to receive light from an associated one of said thermionic devices, and means connecting each of said light sensitive devices to another of said thermionic devices to quench operation thereof.

15. A registering circuit comprising a series of thermionic devices, each of said devices having a coating of fluorescent material on at least a part of the inside of the envelope thereof, and means for producing fluorescent light in said material when the corresponding device is operated, a series of light sensitive devices operatively related to said series of thermionic devices with each of said light sensitive devices arranged to receive fluorescent light from an associated one of said thermionic devices and electrically connected to condition another of said thermionic devices for operation.

16. A registering circuit comprising a pair of thermionic devices, each of said devices having a coating of fluorescent material on at least a part of the inside of the envelope thereof, and means for producing fluorescent light in said material when the corresponding device is operated, a light sensitive device operatively related to said thermionic devices arranged to receive fluorescent light from one of said thermionic devices and electrically connected to condition the other of said thermionic devices for operation.

17. A registering circuit comprising a pair of thermionic devices, each of said devices having a coating of fluorescent material on at least a part of the inside of the envelope thereof, and means for producing fluorescent light in said material when the corresponding device is operated, a pair of light sensitive devices operatively related to said pair of thermionic devices, one of said light sensitive devices being arranged to receive light from one of said thermionic devices, means connecting said one light sensitive device to condition the other of said thermionic devices for operation, the other of said light sensitive devices being arranged to receive light from the other of said thermionic devices, and means connecting said other light sensitive device to quench operation of said one thermionic device.

18. A registering circuit comprising a series of thermionic devices, each of said devices having means for producing fluorescent light when the device is fired, two corresponding series of light sensitive devices associated with said series for operation under control of the fluorescent light produced by firing of said thermionic devices, means connecting one series of said light sensitive devices selectively to said thermionic devices to enable operation thereof and means connecting the other series of said light sensitive devices selectively to said thermionic devices to quench operation thereof.

19. A registering circuit comprising a series of thermionic devices, each of said devices having means for producing fluorescent light when the device is fired, two corresponding series of light sensitive devices associated with said series for operation under control of the fluorescent light produced by firing of said thermionic devices, means connecting one series of said light sensitive devices selectively to said thermionic devices to enable operation thereof, means connecting the other series of said light sensitive devices selectively to said thermionic devices to quench operation thereof, and a common input for controlling operation of said thermionic devices in response to electrical signals applied to said circuit.

20. A registering circuit comprising a series of thermionic devices, each of said devices having means for producing fluorescent light when the device is fired, two corresponding series of light sensitive devices associated with said series for operation under control of the fluorescent light produced by firing of said thermionic devices, means connecting one series of said light sensitive devices to enable said thermionic devices for operation, means connecting the other series of said light sensitive devices to quench operation of said thermionic devices, said light sensitive devices controlling operation of said thermionic devices in response to electrical signals applied to said circuit, and means for reversing the control of said light sensitive devices to reverse the direction of operation of said thermionic devices in response to the same character of electric signals.

21. A registering circuit comprising a series of thermionic devices, each of said devices having means for producing fluorescent light when the device is fired, two corresponding series of light sensitive devices associated with said series for operation under control of fluorescent light produced by firing of said thermionic devices, one series of said light sensitive devices being electrically and selectively connected to enable said thermionic devices for operation and the other series of said light sensitive devices being electrically and selectively connected to quench said thermionic devices, and means for selectively applying said light from each of said thermionic devices to different light sensitive devices of said respective series.

22. In a register, a tens transfer circuit connected between adjacent orders of the register comprising an electrical storage device, a circuit for charging said storage device and a light sensitive device connected to discharge said storage device and transmit an electrical impulse to the next order of the register.

23. In a register, a tens transfer circuit connected between adjacent orders of the register comprising an electrical storage device, a circuit having means for charging said storage device with current of only one polarity, and a light sensitive device connected to discharge said storage device and transmit an electrical impulse to the next order of the register.

24. In a reversible register, a plurality of ordinal series of electric discharge devices, each ordinal series of electric discharge devices representing the values from "0" to "9" and having respective series of enabling and quenching light sensitive means associated therewith and under control of certain of said discharge devices of the series, tens transfer means connected between adjacent ordinal series of said devices, and means for adjusting said discharge devices and said tens transfer means for both positive and negative operation, each of the said tens transfer means comprising a light sensitive device having means associated therewith for energizing it to effect tens transfer operation.

25. In a computing circuit comprising a series of thermionic devices, each of said devices including fluorescent material and having means for producing radiation adapted to cause said material to fluoresce when the corresponding device is energized, said radiation being caused to impinge on said material, each of said devices carrying a legend adjacent said material corresponding to the value to be represented thereby and positioned to be illuminated by said fluorescent material when subjected to said radiation.

26. In a computor, an element carrying fluorescent material, a source of ultra-violet radiation, said source being related to said material to cause fluorescence thereof, and said fluorescent material being adapted to display an indication of a value when caused to fluoresce, and computing means associated with said element and connected in controlling relation to said source of ultra-violet radiation to cause activation thereof as an incident to the computing operation.

27. In a computor, a device having a coating of fluorescent material, a source of ultra-violet radiation, means for conditioning said source of ultra-violet radiation and activating it as a result of a computing operation, said fluorescent material being positioned to be energized by said ultra-violet radiation, a light-sensitive device disposed to receive fluorescent light from said fluorescent material, and circuit means connected to said light-sensitive device for controlling a further computing operation.

28. A registering circuit comprising a thermionic device, said device having a coating of fluorescent material on at least a part of the surface thereof, and means for producing fluorescent light in said material when the device is operated, a light-sensitive device operatively related to said thermionic device to receive fluorescent light from said thermionic device and electrically connected to condition the registering circuit for operation.

29. In a register comprising a plurality of registering orders for registering multiple digit values and a tens transfer circuit connected between adjacent orders of the register, said tens transfer circuit having means for transmitting a pulse from a lower order to a higher order of the register comprising an electrical storage device, a rectifier for rectifying the current to said storage device, a light sensitive device and means for illuminating said light sensitive device when a tens transfer is to be effected.

30. In a register comprising a plurality of registering orders for registering multiple digit values, each order being responsive in step-by-step fashion to individual actuating pulses, and a tens transfer circuit connected between adjacent orders of the register, said tens transfer circuit having means for transmitting a pulse from a lower order to a higher order of the register comprising an electrical storage device, a rectifier for rectifying the current to said storage device, a light sensitive device and means for illuminating said light sensitive device when a tens transfer is to be effected.

*31. An ordinal register as set forth in claim 3 further characterized in that said electric discharge means individually comprise at least one voltage-responsive light source, having a threshold voltage above which it becomes luminant, means for applying a potential across each of said electric discharge means and each of said light-sensitive devices, and each of said light-sensitive devices being electrically coupled to one of said electric discharge means to effect said conditioning and optically coupled to a different one of said electric discharge means to effect said control.*

*32. A register as set forth in claim 3, further characterized in that each of said electric discharge means comprises a device having a cold electron-emitting electrode.*

*33. A register as set forth in claim 5, further characterized in that each of said electric discharge tubes includes a cold electron-emitting electrode.*

*34. An electrical circuit as set forth in claim 5 further characterized in that said electric gas discharge tubes each include a material adapted to emit luminous energy as a result of the electric discharge therein.*

*35. An electrical circuit as set forth in claim 5 further characterized in that said electric gas discharge tubes each include zinc sulphide conditioned to emit luminous energy as a result of the electric discharge therein.*

*36. An electric circuit as set forth in claim 5 further characterized in that said electric gas discharge tubes individually comprise at least one voltage-responsive light source, having a threshold voltage above which it becomes luminant, means for applying a potential across each of said electric discharge tubes and each of said light-responsive means, and each of said light-responsive means being electrically coupled to one of said electric discharge tubes to effect said conditioning and optically coupled to a different one of said electric discharge means to effect said quenching.*

*37. An ordinal register as set forth in claim 11 further characterized in that said thermionic devices each include zinc sulphide conditioned to emit luminous energy as a result of the electric discharge therein.*

*38. An ordinal register as set forth in claim 11 further characterized in that said thermionic devices each include a material adapted to emit luminous energy as a result of the electric discharge therein.*

*39. A registering circuit as set forth in claim 12 further characterized in that each of said thermionic devices comprises a device having a cold electron-emitting electrode.*

*40. An ordinal register as set forth in claim 12 further characterized in that said thermionic devices each include*

*a material adapted to emit luminous energy as a result of the electric discharge therein.*

*41. An ordinal register as set forth in claim 12 further characterized in that said thermionic devices each include zinc sulphide conditioned to emit luminous energy as a result of the electric discharge therein.*

*42. An ordinal registering circuit as set forth in claim 12 further characterized in that said thermionic devices individually comprise at least one voltage-responsive light source, having a threshold voltage above which it becomes luminant, means for applying a potential across each of said thermionic devices and said light-sensitive devices.*

*43. An opto-electronic apparatus comprising a plurality of thermionic devices, each of said devices comprising a light source including a phosphor and electric discharge means for agitating said phosphor to generate light, a plurality of photoconductive elements, a first electrical series combination including a first one of said thermionic devices and a first one of said photoconductive elements, a second electrical series combination including a second one of said thermionic devices and a second one of said photoconductive elements, means for connecting said first series combination and said second series combination electrically in parallel, means for connecting additional ones of said photoconductive elements in controlling relation to said first and said second thermionic devices, and means for optically coupling said second series combination thermionic device to said additional photoconductive element of said first series combination.*

*44. An opto-electronic apparatus comprising a plurality of thermionic devices, each of said devices comprising a light source including a phosphor and electric discharge means for agitating said phosphor to generate light, a plurality of light responsive means providing variable impedances, a first electrical combination comprising a first one of said thermionic devices and a first one of said variable impedance means connected in series, a second electrical combination comprising a second one of said thermionic devices and a second one of said variable impedance means connected in series, said second combination light responsive means being arranged to receive light from said first combination thermionic device, means for optically coupling said thermionic device of said first series combination to another of said variable impedance means and means for connecting said other impedance means in controlling relation to another of said thermionic devices.*

*45. An opto-electronic apparatus comprising a plurality of thermionic devices, each of said devices comprising a light source including a phosphor and electric discharge means for agitating said phosphor to generate light, a plurality of photoconductive elements, means for energizing a first electrical series combination that includes a first one of said thermionc devices and a first one of said photoconductive elements, means for connecting said second one of said thermionic devices and a second one of said photoconductive elements in a second electrical series combination, and means for connecting said first series combination and said second series combination electrically in parallel.*

References Cited in the file of this patent or the original patent

UNITED STATES PATENTS

| | | |
|---|---|---|
| 2,156,969 | Bryce | May 2, 1939 |
| 2,176,720 | Rayner et al. | Oct. 17, 1939 |
| 2,219,676 | Barber | Oct. 29, 1940 |
| 2,234,832 | Potts | Mar. 11, 1941 |
| 2,295,000 | Morse | Sept. 8, 1942 |
| 2,310,105 | Michel | Feb. 2, 1943 |
| 2,398,771 | Compton | Apr. 23, 1946 |
| 2,401,621 | Desch et al. | June 4, 1946 |
| 2,402,988 | Dickinson | July 2, 1946 |
| 2,426,278 | Mumma | Aug. 26, 1947 |
| 2,442,428 | Mumma | June 1, 1948 |
| 2,484,115 | Palmer et al. | Oct. 11, 1949 |
| 2,495,075 | Mumma | Jan. 17, 1950 |
| 2,895,054 | Loebner | July 14, 1959 |
| 2,900,522 | Reis | Aug. 8, 1959 |
| 2,905,522 | Reis | Aug. 18, 1959 |
| 2,907,001 | Loebner | Sept. 29, 1959 |

FOREIGN PATENTS

| | | |
|---|---|---|
| 502,560 | Great Britain | Mar. 20, 1939 |
| 521,871 | Great Britain | June 3, 1940 |